United States Patent
Coursaget

(10) Patent No.: US 7,127,906 B2
(45) Date of Patent: Oct. 31, 2006

(54) COOLED PHOTOSENSITIVE CELL

(75) Inventor: Francois Coursaget, Paris (FR)

(73) Assignee: Sagem, SA, Paris (FR)

( * ) Notice: Subject to any disclaimer, the term of this patent is extended or adjusted under 35 U.S.C. 154(b) by 0 days.

(21) Appl. No.: 10/870,575

(22) Filed: Jun. 17, 2004

(65) Prior Publication Data

US 2005/0017180 A1   Jan. 27, 2005

(30) Foreign Application Priority Data

Jun. 20, 2003   (FR) .................................. 03 07481

(51) Int. Cl.
F25D 23/12   (2006.01)
(52) U.S. Cl. ..................... 62/259.2; 250/352
(58) Field of Classification Search .............. 62/51.1, 62/259.2; 250/352, 370.15, 370.1
See application file for complete search history.

(56) References Cited

U.S. PATENT DOCUMENTS

| 4,451,735 | A | * | 5/1984 | Diedrich et al. ............. 250/352 |
| 4,488,414 | A |   | 12/1984 | Jungkman et al. |
| 4,546,614 | A | * | 10/1985 | Kline et al. ..................... 62/62 |
| 4,546,621 | A | * | 10/1985 | Kline et al. .................... 62/51.1 |
| 4,833,898 | A | * | 5/1989 | Chudy et al. ................. 62/51.1 |
| 4,954,708 | A | * | 9/1990 | Salzer et al. ................. 250/352 |
| 4,995,236 | A |   | 2/1991 | Rouquier et al. |
| 5,077,979 | A | * | 1/1992 | Skertic et al. ................. 62/51.2 |
| 5,198,671 | A |   | 3/1993 | Hatch et al. |
| 5,296,710 | A | * | 3/1994 | Ohno et al. .................. 250/352 |
| 5,382,797 | A |   | 1/1995 | Kunimoto et al. |
| 5,590,538 | A | * | 1/1997 | Hsu et al. ..................... 62/51.2 |
| 5,763,885 | A | * | 6/1998 | Murphy et al. ............. 250/352 |
| 6,156,978 | A | * | 12/2000 | Peck et al. .................... 174/151 |
| 6,184,757 | B1 | * | 2/2001 | Rosenthal et al. ........ 333/99 S |
| 6,430,941 | B1 | * | 8/2002 | Mordechai et al. .......... 62/51.2 |

FOREIGN PATENT DOCUMENTS

| EP | 0 493 208 A1 | 7/1992 |
| EP | 0 899 795 A2 | 3/1999 |
| JP | 4-261066 A * | 9/1992 |
| JP | 4-350979 * | 12/1992 |
| JP | 06 235657 | 8/1994 |

OTHER PUBLICATIONS

International Search Report, Mar. 8, 2004.

* cited by examiner

Primary Examiner—Mohammad M. Ali
(74) Attorney, Agent, or Firm—Quarles & Brady LLP

(57) ABSTRACT

The cooled photosensitive cell (1) according to the invention comprises a table (2), a sensor (3) which is fitted on the table (2) and is connected to electrical connection tracks (30), a screen (10) to prevent parasitic radiation on the sensor (3), and a Joule-Thomson cooler (4) in order to cool the table (2) and the screen (10). The table (2) and the screen (10) are cooled by convection by being subjected directly to the volume of expansion of the cooler (4), the table (2) being provided with apertures (6) for passage of the cooling flow communicating with a cavity (14) for cooling of the screen (10).

8 Claims, 2 Drawing Sheets

COOLED PHOTOSENSITIVE CELL

The present invention relates to cooled photosensitive cells, thermal photosensitive cells or quantal photosensitive cells.

The term photosensitive cell will be used hereinafter. A photosensitive cell generally consists of one or a plurality of sensor(s) fitted on a cold table which is cooled by a cooler.

In the case of applications which require very rapid cooling, for example in the use of photosensitive cells in self-propelled and remote controlled devices, use is made of a cooler of the Joule-Thomson expansion type, in which a gas expands at the output from a jet and reaches its minimal temperature at the point of equilibrium between the solid and liquid phases. This cooler makes it possible to cool the table, and for this purpose must overcome the thermal inertia of the latter.

In addition, the sensors of the photosensitive cell must be protected against parasitic radiation by means of a screen which is integral with the cold table, which must also be cooled and also has thermal inertia to be overcome.

Mechanical devices have been proposed in order to permit cooling of the cold table and of the screen, whilst assuring the thermal homogeneousness of the assembly. Certain devices carry out this cooling by conduction, but this type of cooling is too slow because of the thermal inertia.

The French patent application filed by the applicant under number FR 01 16 863 proposes cooling of both the table and the screen by convection, by subjecting them to the expansion volume of the cooler. FIG. 1 represents an embodiment of a photosensitive cell of this type. In this device 1', a table 2', on which a sensor 3' is placed, is provided with apertures 4', 5' for passage of the cooling flow, which communicate with an annular cavity 6' for cooling of a screen 7', the cavity 6' extending between two cylindrical envelopes 8', 8" which are secured to the table 2'. An annular flange 9' partially closes the space 10' inside the inner envelope 8" of the screen, thus acting as a diaphragm for the sensor 3'. In addition, electrical connection tracks are disposed in an inner layer beneath the screen, in the thickness of the table 2'.

The solution proposed permits efficient cooling. The applicant has pursued developments in order to eliminate certain disadvantages.

In fact, placing the electrical connection tracks in the inner layers of the table 2' gives rise to electrical interference which leads to noise on the signal. In addition, this placing in an inner layer is difficult and costly to implement.

The annular flange 9' which is placed at the top of the annular cavity 6' is cooled by conduction, and therefore more slowly than the remainder of the device 1'.

Fitting of the photosensitive cell is not very simple. It is necessary to weld the cylindrical envelopes 8', 8" onto the table 2', then secure the sensor(s) 3' on the table 2', before securing the annular flange 9' at the top of the envelopes 8', 8", this operation necessarily being carried out after the securing of the sensor 3', since the inner diameter of the flange 9' is smaller than that of the sensor 3'. Thus, it is not possible, for example, to carry out sealing tests on the photosensitive cell 1' without a sensor 3', in order to avoid damaging the sensor, since the latter cannot be put into place last in the device 1'.

The present invention aims to eliminate these disadvantages.

For this purpose, the present invention relates to a cooled photosensitive cell comprising a table, at least one sensor which is fitted on the table and is connected to electrical connection tracks, a screen which is fitted on the table in order to prevent parasitic radiation on the sensor, at least one Joule-Thomson cooler in order to cool the table and the screen, wherein the table and the screen are cooled by convection by being subjected directly to the volume of expansion of the cooler, the table being provided with apertures for passage of the cooling flow communicating with a cavity for cooling of the screen, characterised in that that table comprises on its periphery a shoulder on which the screen is fitted, a passage for the sensor and the electrical connection circuits being provided between the table and the screen.

"Shoulder" means any means which is raised relative to the plane on which the sensor rests.

Preferably, the screen comprises two envelopes with a substantially frusto-conical shape which are secured to the shoulder of the table, defining between one another the cavity for cooling of the screen.

The present invention will be better understood by means of the following description of the preferred embodiment of the invention, provided with reference to the attached drawing, in which.

Figure 1:
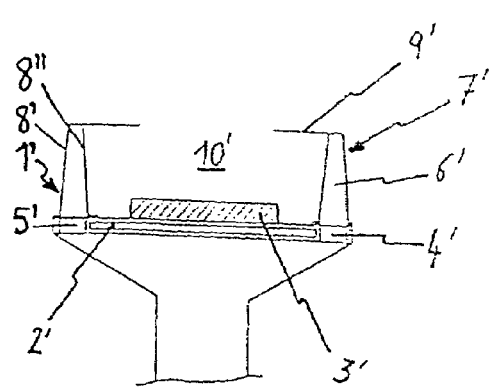
FIG. 1 represents a schematic view in cross-section of a photosensitive cell according to the prior art.
Figure 2:
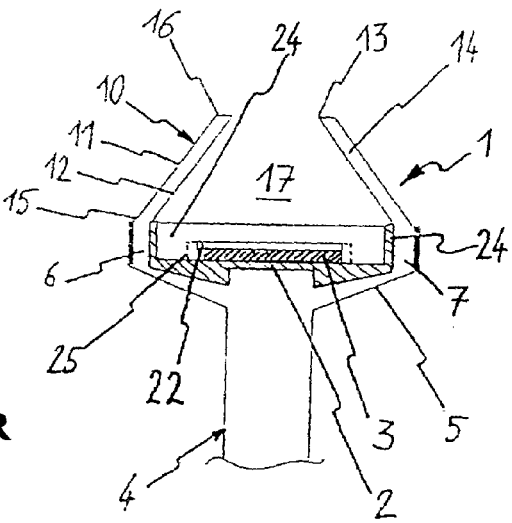
FIG. 2 represents a schematic view in cross-section of the photosensitive cell according to the invention.

With reference to FIG. 2, a photosensitive cell 1 generally comprises one or a plurality of sensor(s) 3 which are fitted on a circular table 2, which is cooled by a Joule-Thomson cooler 4 fitted in a cryostat well (cold finger) which is connected to the table by a frusto-conical portion 5 which widens in the direction of the table 2. A description will be provided hereinafter of a photosensitive cell 1 which is provided with a single sensor 3, the possibility of general applications to a plurality of sensors being apparent. The Joule-Thomson cooler comprises a pipe coil which is supplied with high-pressure gas and ends in a jet from which the gas is ejected; the minimal temperature is reached at the point of equilibrium between the gaseous phase and the liquid phase, the temperature to be reached determining the choice of the gas. This device is not represented, since it is well known according to the prior art. The photosensitive cell assembly 1 is isolated by vacuum or by a neutral gas in a cryostat, not represented.

Figure 3:
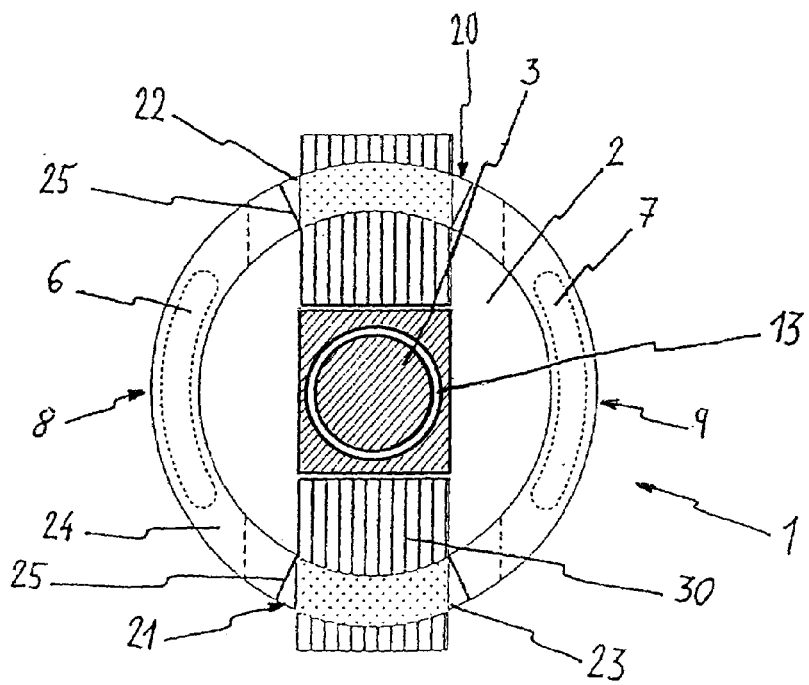
FIG. 3 represents a schematic plan view of the photosensitive cell according to the invention.

With reference to FIGS. 2 and 3, the circular table 2 comprises a circular shoulder 24 which is placed around its contour. This shoulder 24 is raised relative to the table by a height which is greater than that of the tracks of electrical connections 30; the thickness of the shoulder 24 means its width measured parallel to the table. In two diametrically opposed regions 8, 9, the shoulder 24 is provided in the direction of the height with two vents 6, 7 for passage of the cooling flow. Two other vents 22, 23 are provided, this time in the direction of the thickness of the shoulder 24, in two diametrically opposed regions 20, 21, and offset by 90° relative to the two regions 8, 9 in which the first aforementioned vents 6, 7 are provided. These vents 22, 23 permit passage of the sensor 3 and of the electrical connection tracks 30 of the photosensitive cell 1. The electrical connection tracks 30 are contained in a substrate, forming a sheet, to which the sensor 3 is glued. According to another embodiment, the tracks are created by means of a flexible line which is connected directly to the sensor 3, thus dispensing with the presence of the substrate.

The vents 22, 23 for passage of the electrical connection tracks 30 comprise bevels 25 which permit introduction of the sensor 3 and electrical connection tracks 30. If the opening of the vents 22, 23 were too large, consequently permitting passage of parasitic rays which could impede the satisfactory operation of the photosensitive cell 1, it would be possible, once the photosensitive cell 1 and the sensor 3 had been fitted, to place a protective ring around the outer wall of the table 2. It would also be possible to close these vents 22, 23 with glue or another material.

By means of the vents 22, 23 for passage of the electrical connection tracks 30, the sensor 3 and the electrical connection tracks 30 can be put into place last; once the remainder of the photosensitive cell 1 has been fitted integrally. In particular it is possible to carry out tests, for sealing for example, on the photosensitive cell 1 without the sensor 3, without thus risking damaging the latter. The sheet of electrical connection circuits 30 on which the sensor 3 is also glued can then be introduced into the space 17 inside the inner envelope 12 of the screen 10, via the vents 22, 23. The sensor 3 is placed in the centre of the table 2. It is also possible to change the sensor 3 without changing the photosensitive cell 1.

According to the other embodiment previously referred to, the sensor 3 is placed directly on the table 2 from above, before the screen 10 is fitted, and the sensor 3 is then wired to the electrical tracks 30 (which are flexible lines), introduced via the vents 22, 23. This solution does not make it possible to test the sealing of the photosensitive cell without the sensor 3. On the other hand, it facilitates considerably the fitting of the assembly, and makes it possible to reduce the size of the vents 22, 23, thus limiting the parasitic rays.

Figure 4:
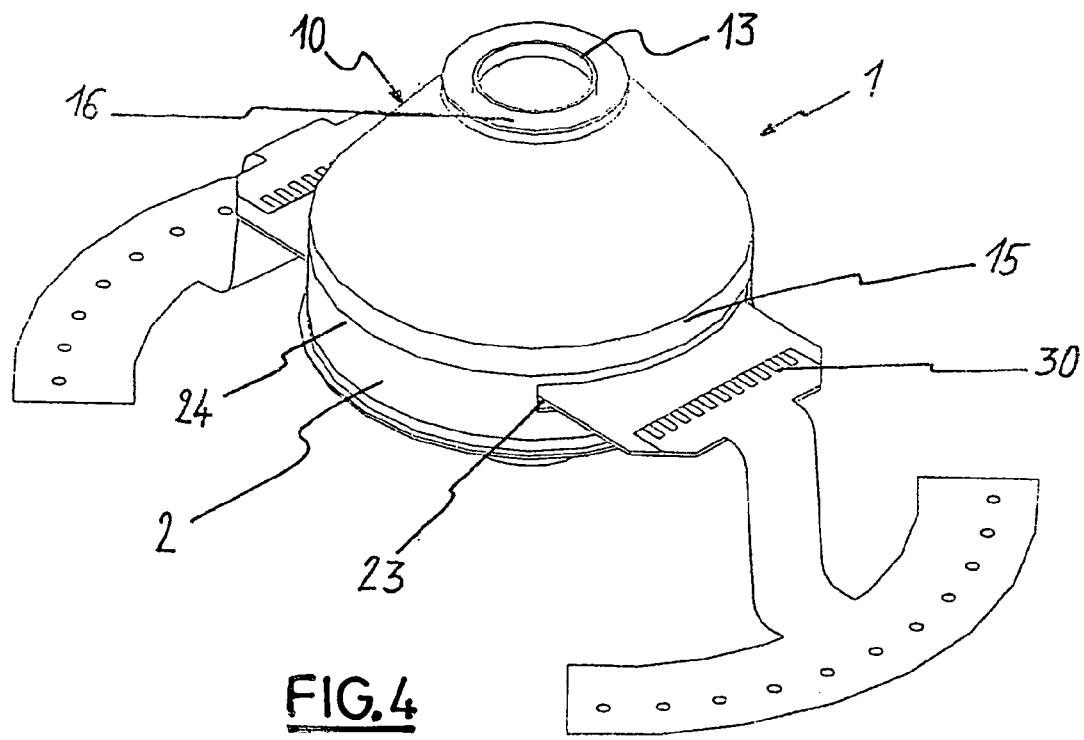
FIG. 4 represents a perspective view of the photosensitive cell according to the invention.
Figure 5:
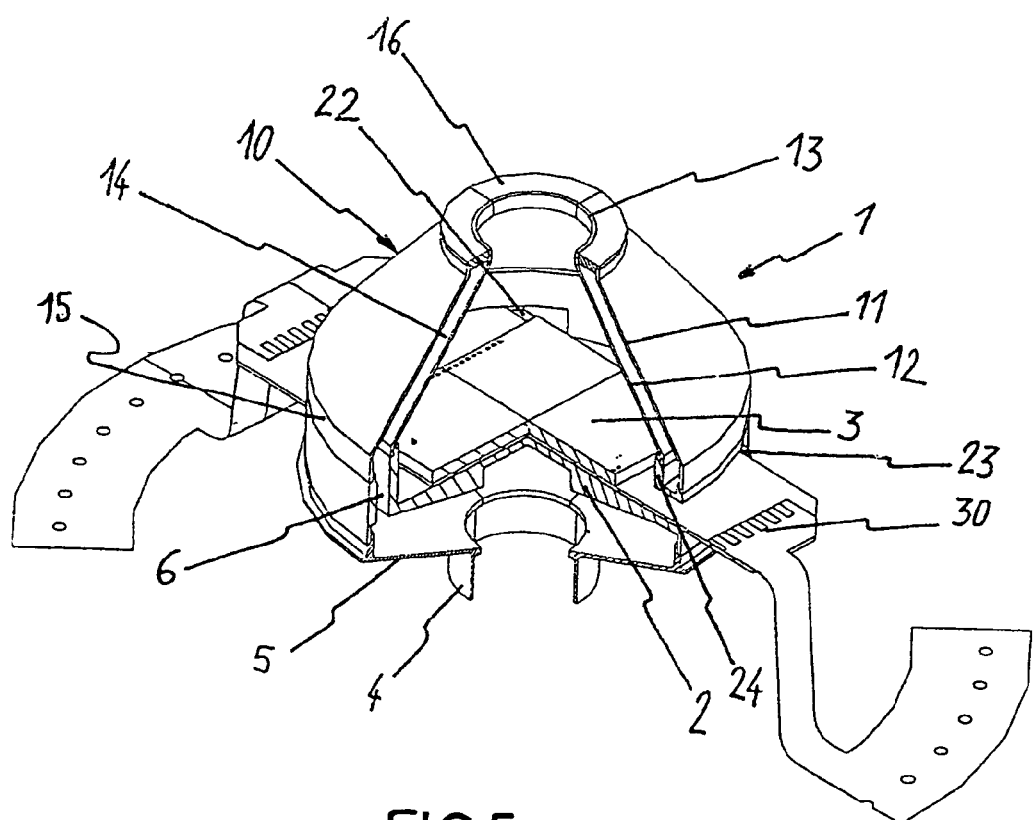
FIG. 5 represents a partially cut-out perspective view of the photosensitive cell according to the invention.

With reference to FIGS. 4 and 5, on the shoulder 24 of the table 2 there is fitted a screen 10 for protection against the parasitic rays; it can be glued or welded onto the table 2, or it can be machined integrally with the table 2. This screen 10 comprises two envelopes 11, 12 in order to provide a cavity 14 for circulation of the cooling flow, which cavity communicates with the vents 6, 7 for passage of the cooling flow. The form of the envelopes 11, 12 of the screen 10 is such that the opening 13 in the top 16 of the screen 10 has dimensions smaller than those of the base 15 of the screen 10, and in particular smaller than the dimensions of the sensor 3. The screen 10 thus acts as an optical diaphragm for the sensor 3, owing to the dimensions of its opening 13.

The configuration adopted allows the screen 10 not only to act thus as an optical diaphragm, but also to be cooled by convection, by means of the cooling flow in the cavity 14 between the two envelopes 11, 12, from the base 15 of the cavity to its top 16.

In the preferred embodiment of the photosensitive cell 1 according to the invention, the envelopes 11, 12 have a frusto-conical shape. This shape is the most compact one possible for transition from a base circle 15 to a smaller top circle 16. This compactness improves the cooling since the thermal mass is lower. This configuration also improves the rapid rising of the gases towards the screen 10. In addition, the rigidity of this embodiment allows it to meet the vibratory requirements which are inherent in the usage made of the sensors.

In operation, the cooling gas is supplied via the cryostat finger. It is then diffused in the frusto-conical portion 5 for connection to the table 2, thus cooling the table 2, as well as in the cavity 14 of the screen 10, via the vents 6, 7, by this means assuring the cooling of the screen 10. The frusto-conical configuration of the screen 10 makes it possible to obtain a diaphragm 13 spaced from the sensor 3, which is advantageous from an optical point of view, efficient cooling of the screen 10 nevertheless also being assured.

The invention claimed is:

1. Cooled photosensitive cell (1) comprising a table (2), at least one sensor (3) which is fitted on the table (2) and is connected to electrical connection tracks (30), a screen (10) which is fitted on the table (2) in order to prevent parasitic radiation on the sensor (3), at least one Joule-Thomson cooler (4) in order to cool the table (2) and the screen (10) with a cooling flow, wherein the table (2) and the screen (10) are cooled by convection by being subjected directly to the cooling flow of the cooler (4), the table (2) being provided with apertures (6, 7) for passage of the cooling flow communicating with a cavity (14) for cooling of the screen (10), wherein the table (2) comprises on its periphery a shoulder (24), having a thickness, on which the screen (10) is fitted, the shoulder (24) being raised relative to the table (2) by a height which is greater than the electrical connection tracks (30), a passage (22, 23) for the electrical connection circuits (30) being provided, in the thickness of the shoulder (24), between the table (2) and the screen (10), such that the electrical connection circuits (30) lay upon, and not within, the table.

2. Photosensitive cell according to claim 1, wherein the passage (22, 23) also permits passage of the sensor (3).

3. Photosensitive cell according to claim 1, wherein the passage (22, 23) consists of two openings (22, 23) provided in the thickness of the shoulder (24).

4. Photosensitive cell according to claim 1, wherein the screen (10) comprises two envelopes (11, 12) with a substantially frusto-conical shape which are secured to the shoulder (24) of the table (2), defining between one another the cavity (14) for cooling of the screen (10).

5. Photosensitive cell according to claim 1, wherein the screen (10) is machined integrally with the table (2).

6. Photosensitive cell according to claim 1, wherein the apertures (6, 7) for passage of the cooling flow are diametrically opposed.

7. Photosensitive call according to claim 3, wherein the apertures in the passage (22, 23) are diametrically opposed and offset by 90° relative to the apertures (6, 7) for passage of the cooling flow.

8. Photosensitive cell according to claim 1, wherein the apertures in the passage (22, 23) are chamfered (25).

* * * * *